United States Patent [19]
Lee

[11] Patent Number: 5,828,094
[45] Date of Patent: Oct. 27, 1998

[54] MEMORY CELL STRUCTURE HAVING A VERTICALLY ARRANGED TRANSISTORS AND CAPACITORS

[75] Inventor: Joo-Young Lee, Seoul, Rep. of Korea

[73] Assignee: Samsung Electronics Co., Ltd., Suwon, Rep. of Korea

[21] Appl. No.: 406,337

[22] Filed: Mar. 17, 1995

[30] Foreign Application Priority Data

Mar. 17, 1994 [KR] Rep. of Korea ............... 1994 5372

[51] Int. Cl.⁶ .................................. H01L 27/108
[52] U.S. Cl. ................. 257/296; 257/300; 257/303; 257/304; 257/306
[58] Field of Search ........................... 257/296, 300, 257/303, 304, 306, 301, 302

[56] References Cited

U.S. PATENT DOCUMENTS

| | | | |
|---|---|---|---|
| 4,937,641 | 6/1990 | Sunami et al. | 257/302 |
| 5,504,357 | 4/1996 | Kim et al. | 257/306 |

OTHER PUBLICATIONS

IBM, TDB vol. 34 No. 7B, "Method of Fabricating a New Merged Stacked Trench Capacitor Memory Cell", Dec. 1991, pp. 472–476.

*Primary Examiner*—Mahshid D. Saadat
*Assistant Examiner*—Valencia Martin Wallace
*Attorney, Agent, or Firm*—Cushman Darby & Cushman, IP Group of Pillsbury Madison & Sutro LLP

[57] ABSTRACT

A buried bit line cell and a manufacturing method thereof increases the integration density of a semiconductor device such as a DRAM. The semiconductor device includes: a semiconductor substrate having a plurality of spaced apart first pillars formed therein with isolated first trenches therebetween and second pillars connected to the first pillars thereunder with isolated second trenches therebetween; a first isolation insulating layer formed inside the first trenches and isolated by a gate insulating layer and gate electrode enclosing the first pillars; impurity-doped regions having a first and second impurity-doped region vertically formed in the first and second pillars and a channel region therebetween; a bit line formed in the bottom and on the sidewalls of the second trenches and connected to the impurity-doped regions; a second isolation insulating layer formed in the bottom of the first trenches and inside the second trenches, for isolating the bit lines; and a word line isolated by the first isolation insulating layer and connected to the gate electrode. Problems due to a deep trench and step formation are resolved by controlling the height of the first and second pillars and the storage node of a capacitor.

5 Claims, 17 Drawing Sheets

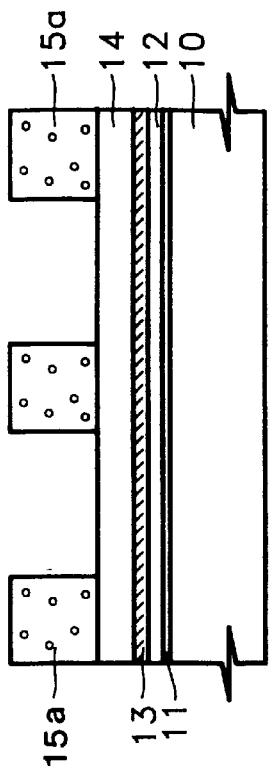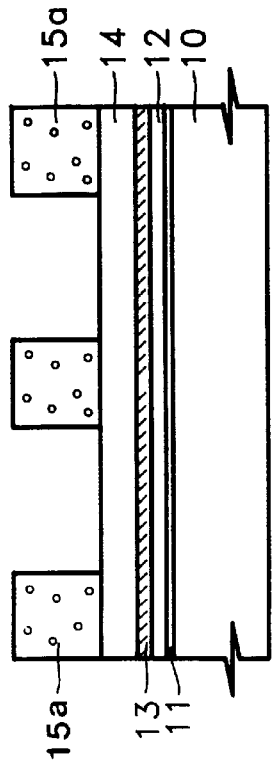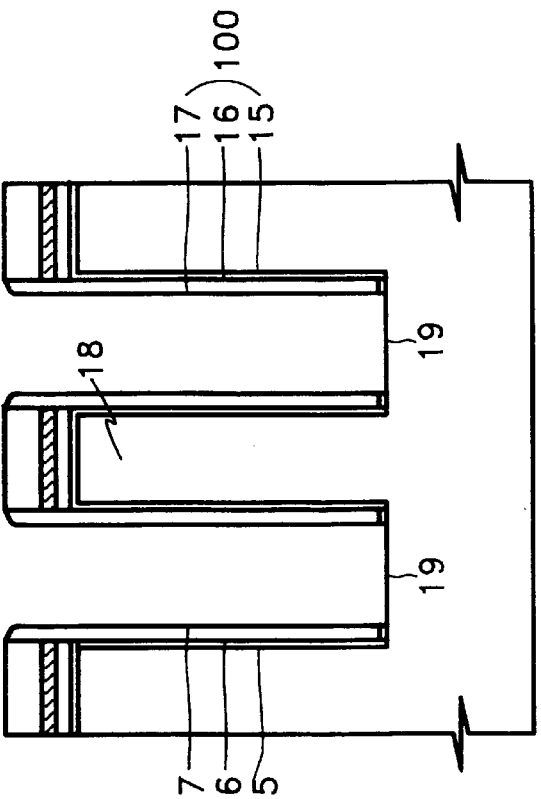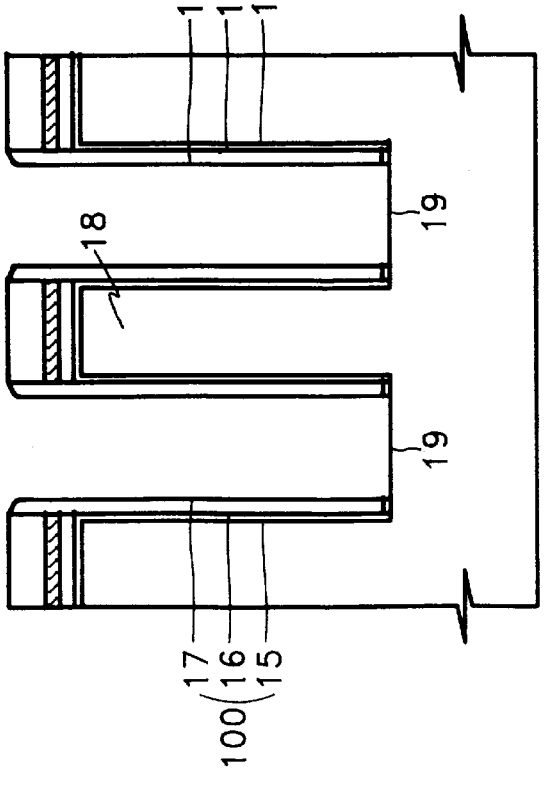

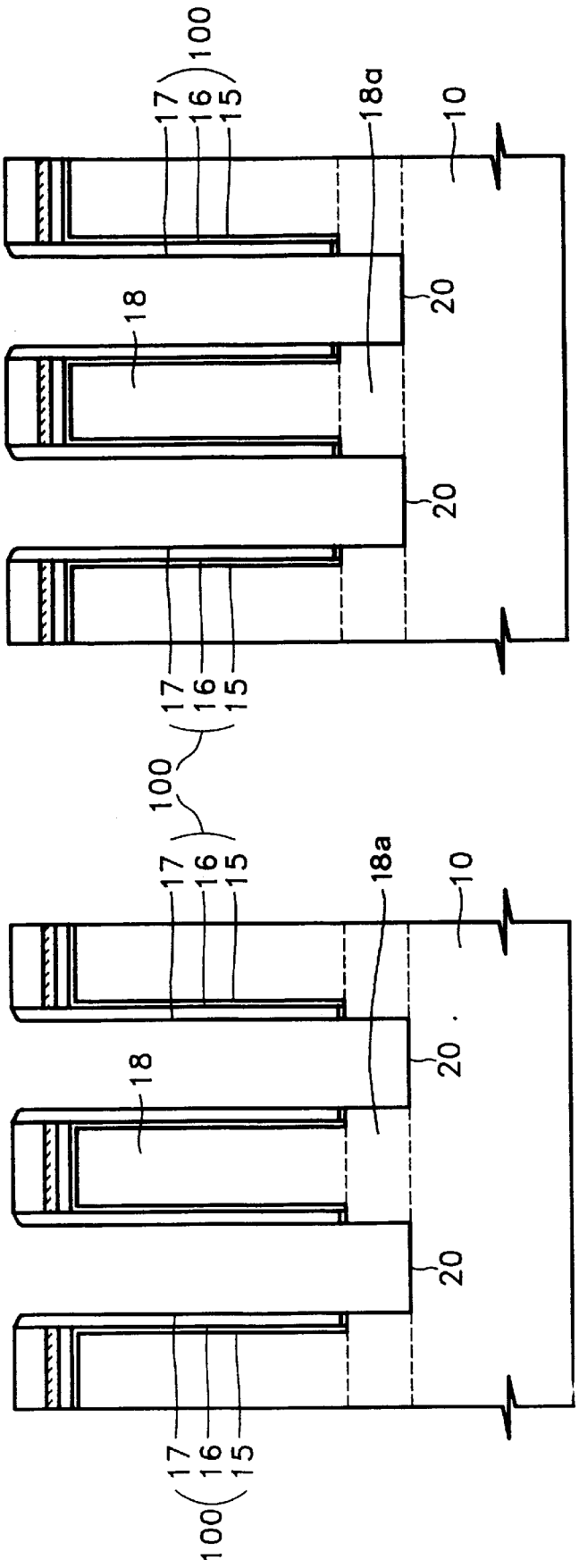

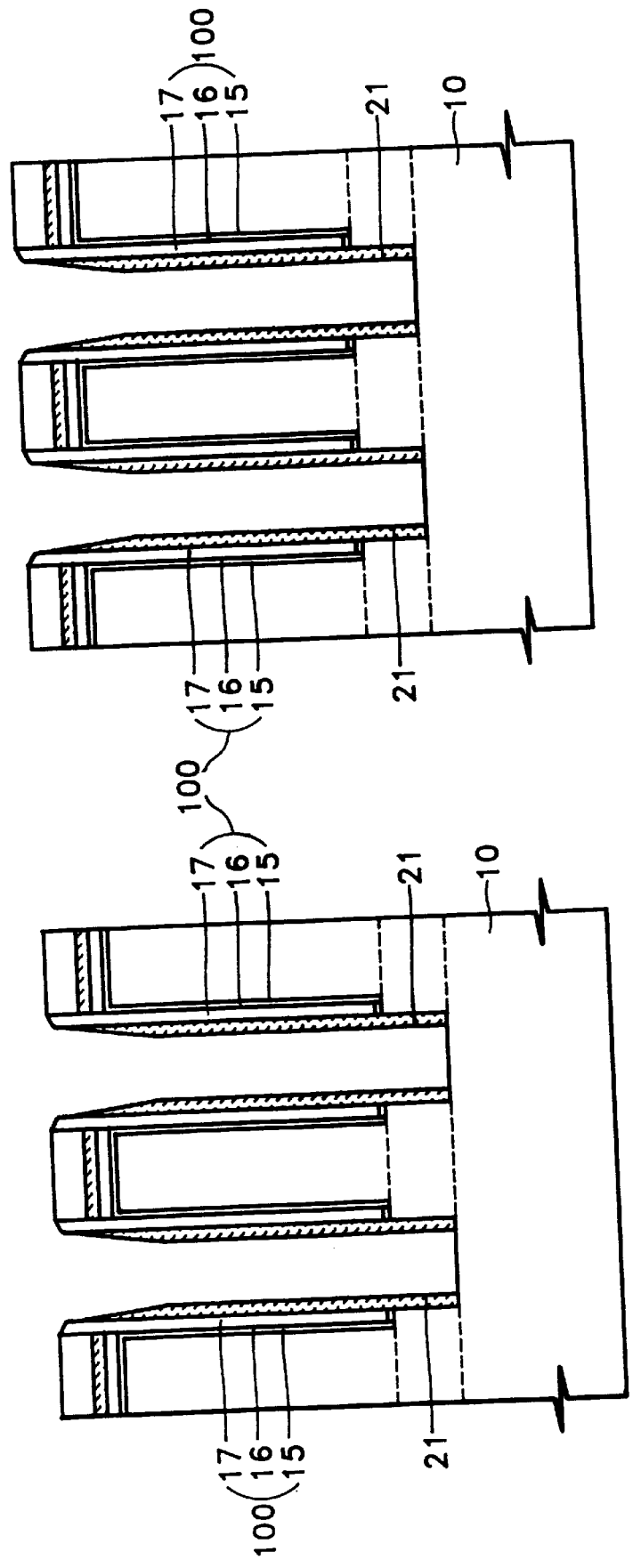

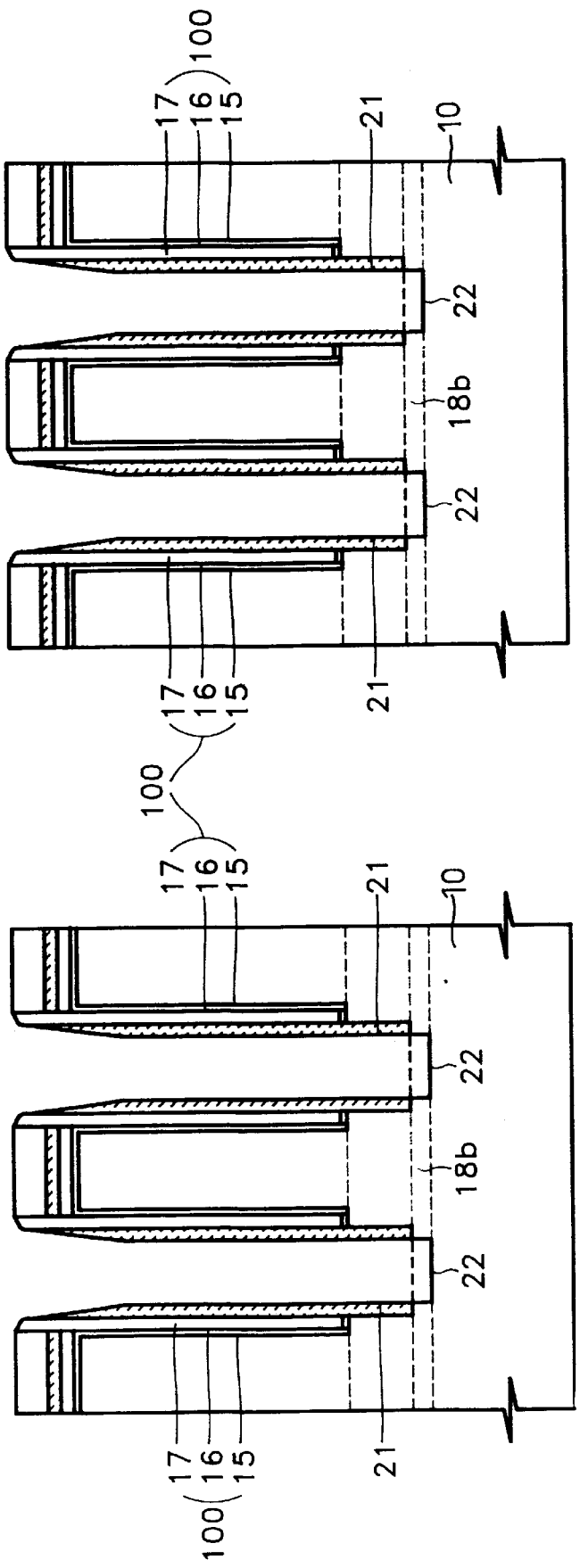

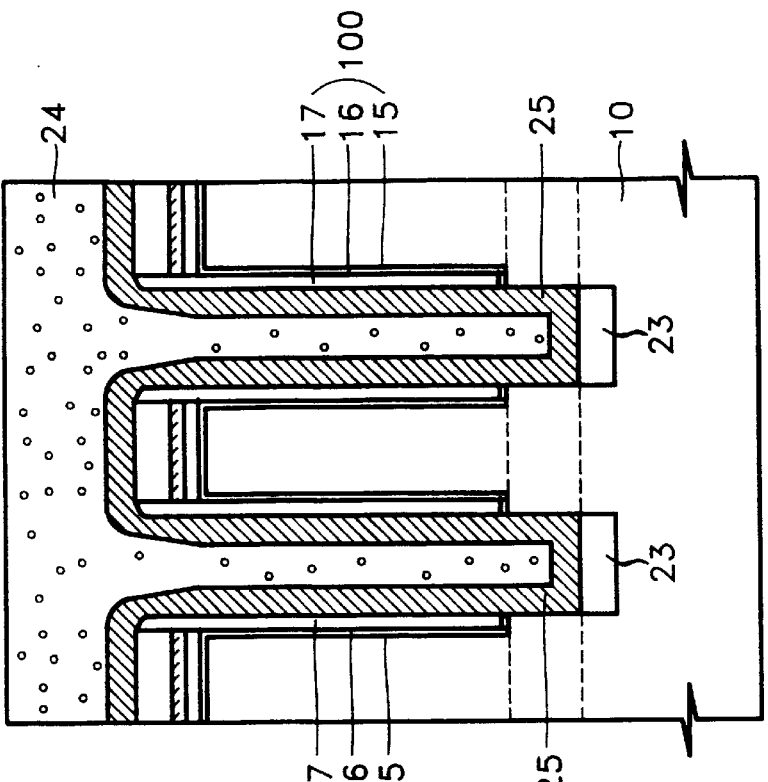
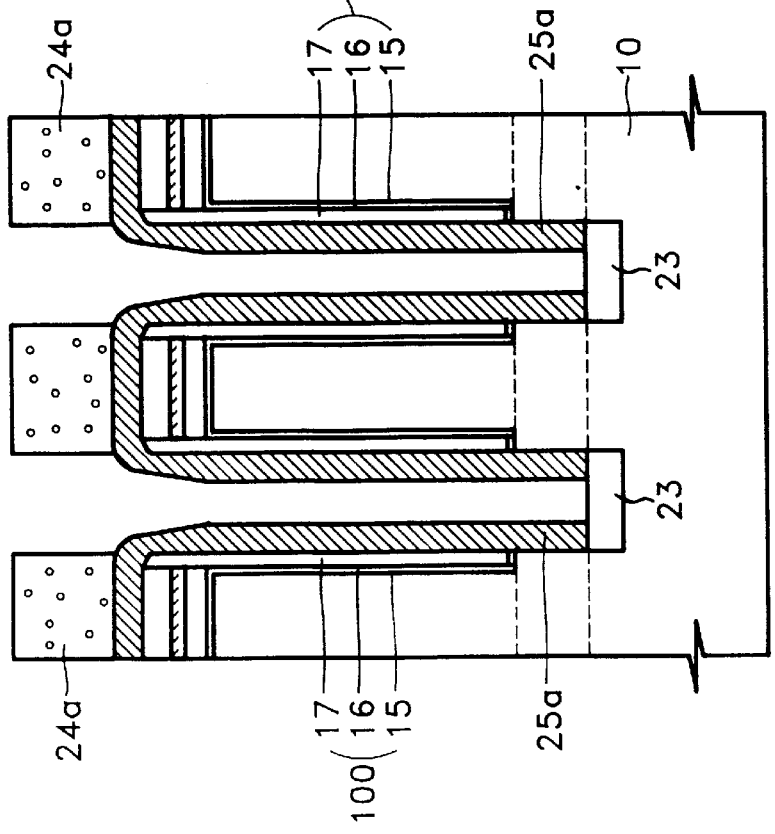

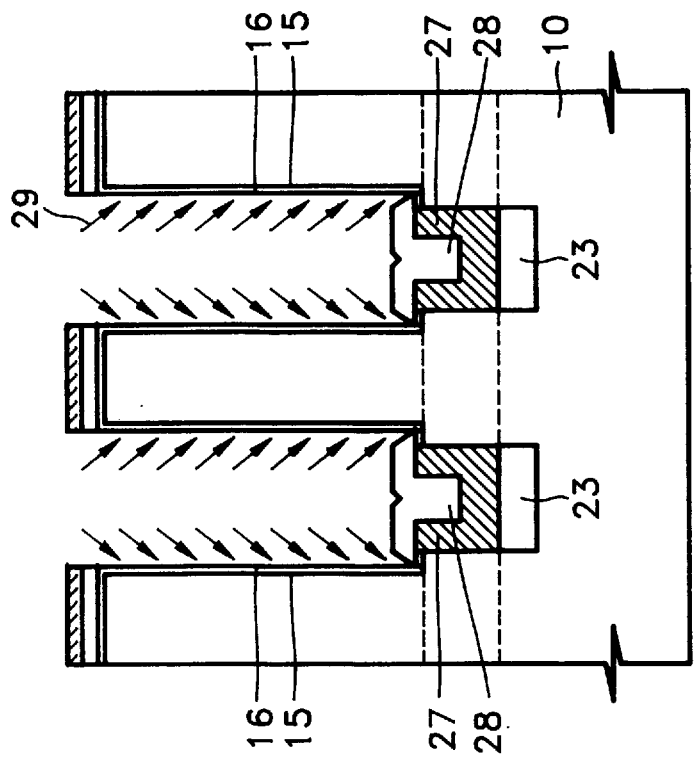
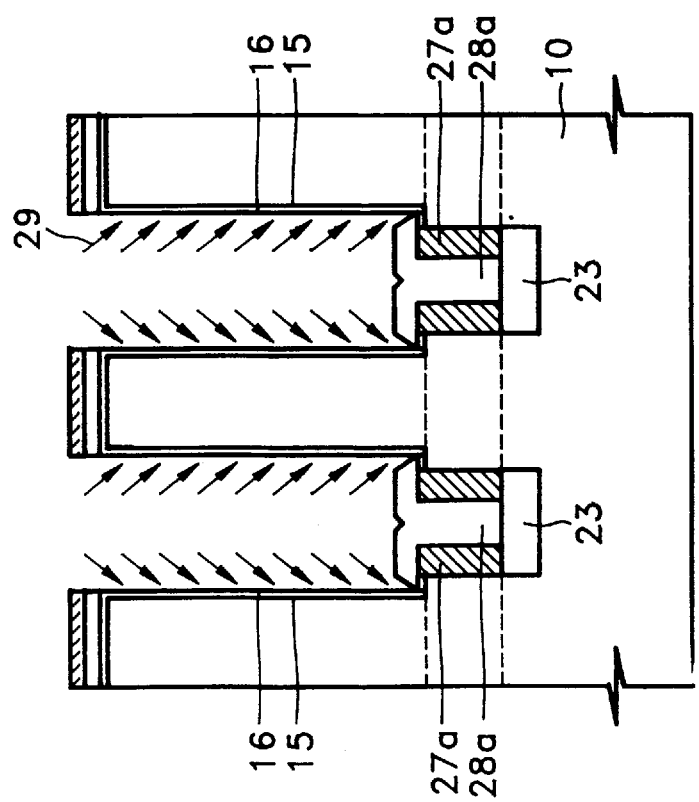

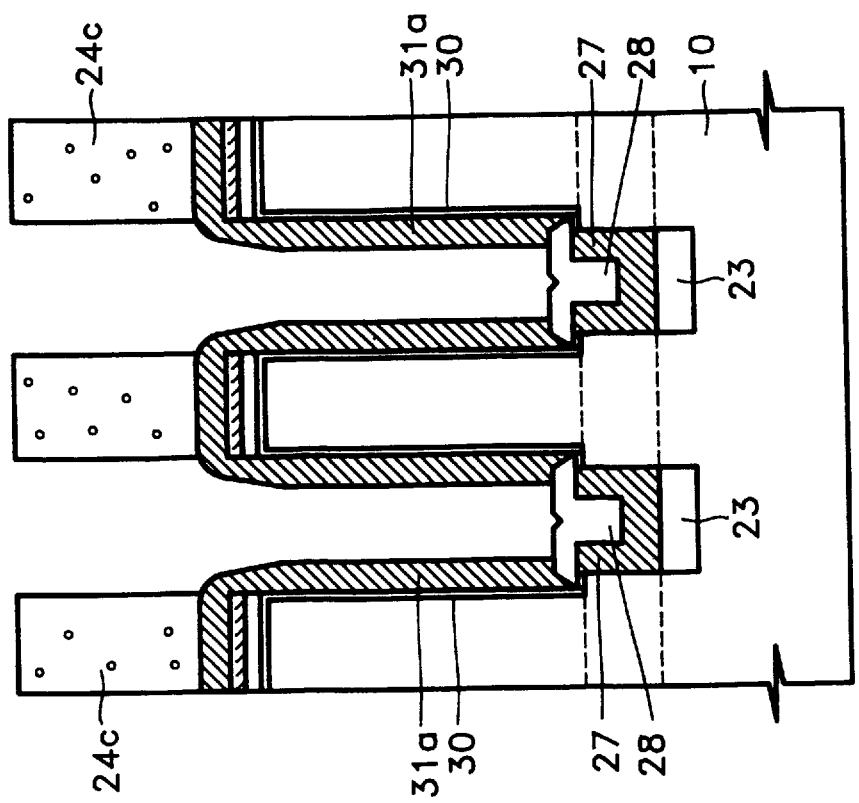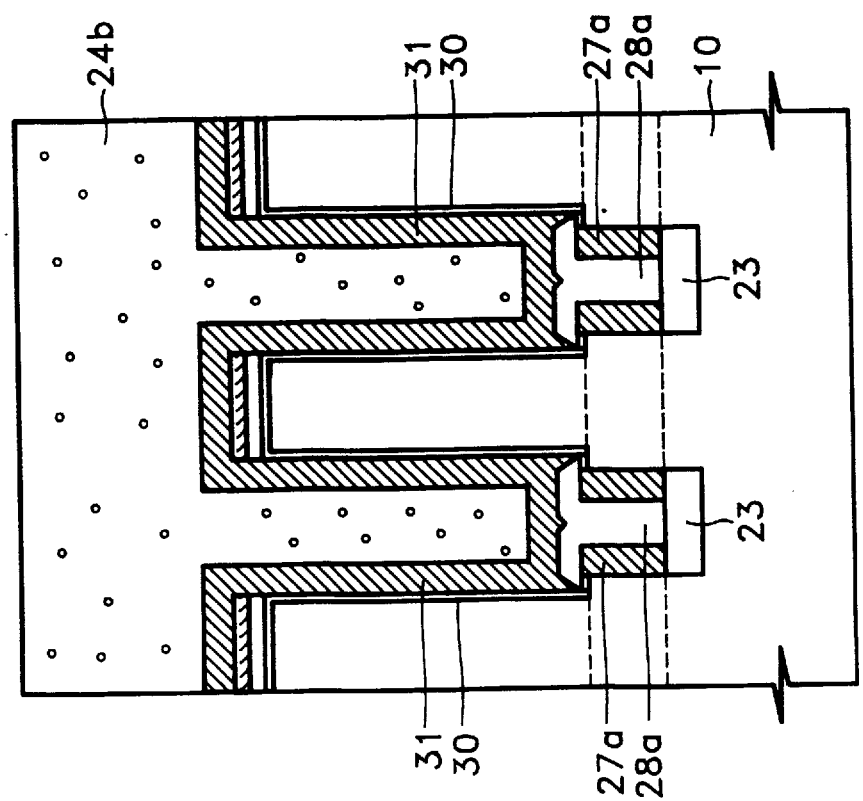

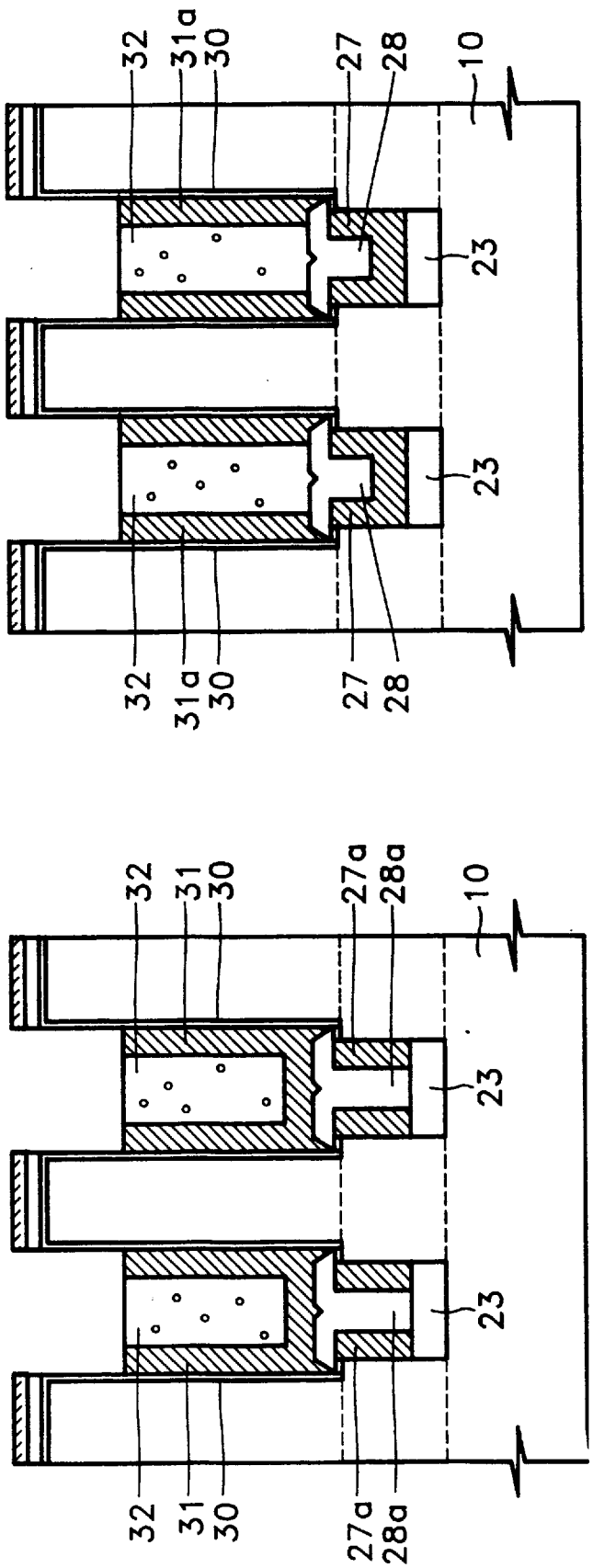

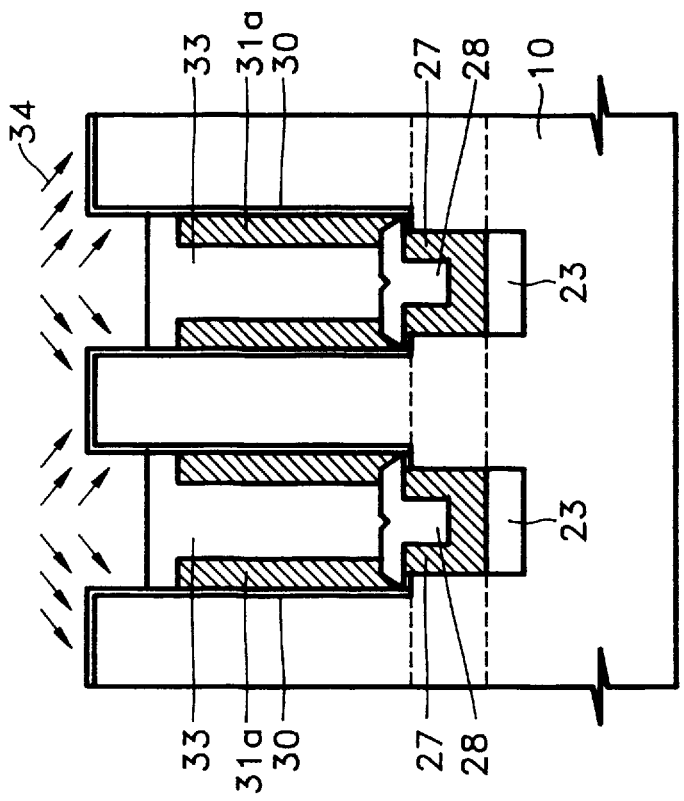
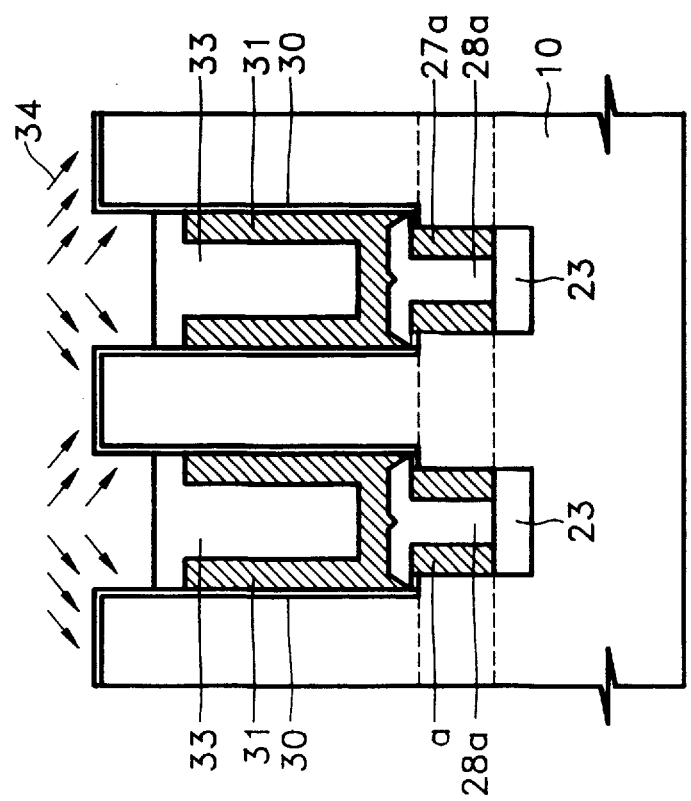

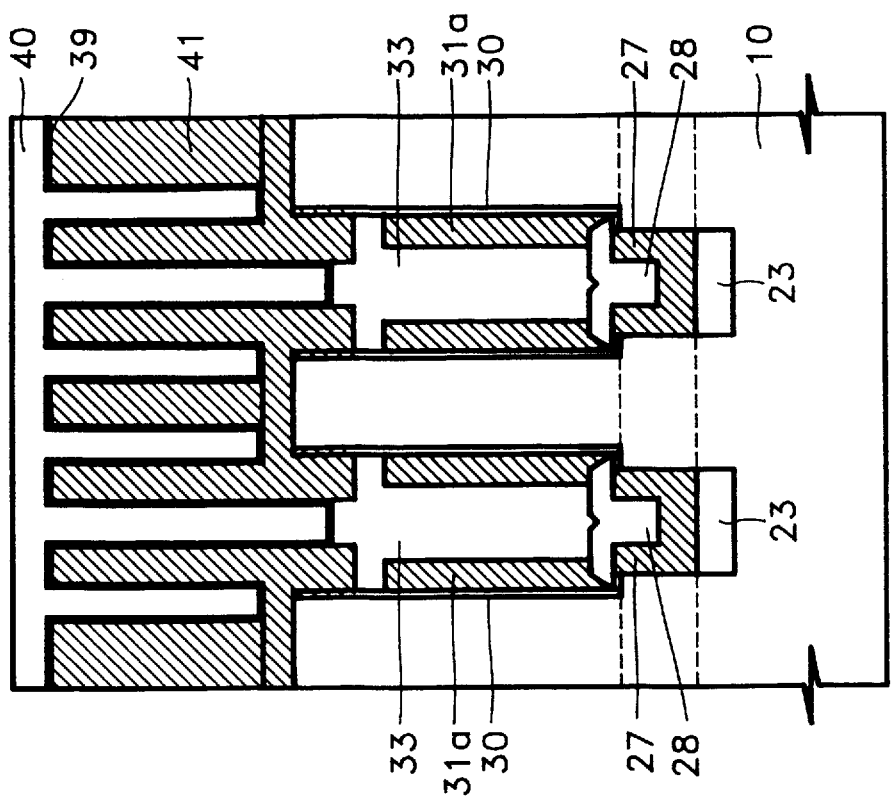
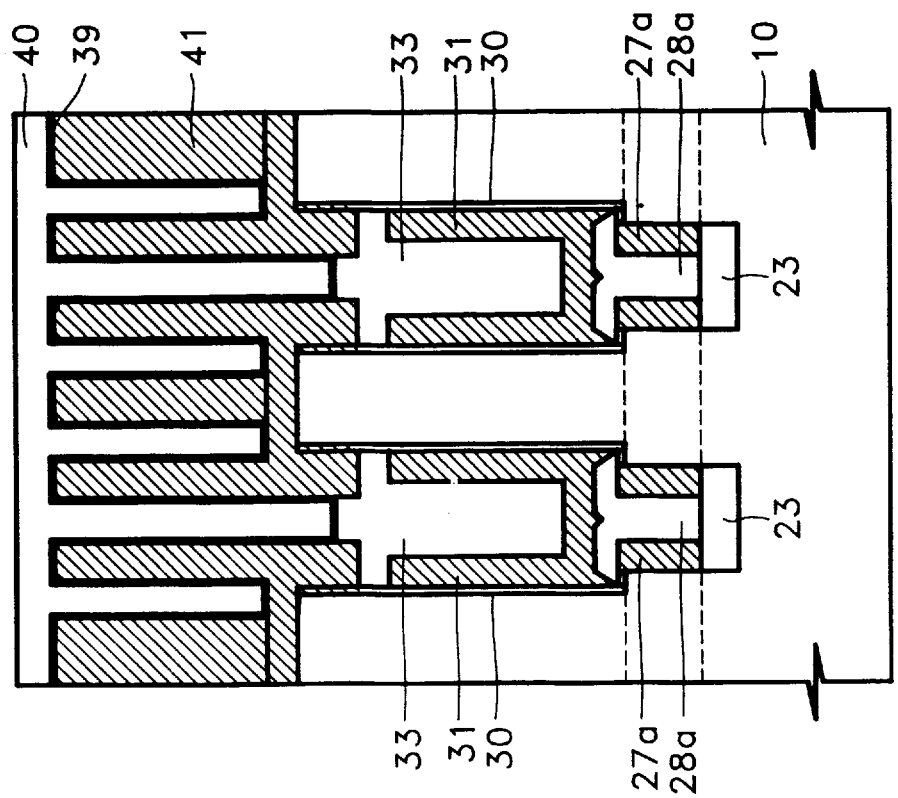

MEMORY CELL STRUCTURE HAVING A VERTICALLY ARRANGED TRANSISTORS AND CAPACITORS

BACKGROUND OF THE INVENTION

The present invention relates to a semiconductor device and a method for manufacturing the same, and more particularly, to a buried bit line cell for increasing integration density, and the manufacturing method thereof.

It is very important to integrate many devices in an unit area, so as to increase the integration density of a memory cell, e.g., a dynamic random access memory (DRAM) cell. The area occupied by a DRAM cell consisting of one transistor and one capacitor must be $0.3 \mu m^2$ or less for the newest, next-generation devices (Gbit DRAMs). However, the $0.3 \mu m^2$ area is only a contact hole area for interconnection in current Mbit DRAMs. Accordingly, it is almost impossible to construct one transistor, one capacitor and one contact hole for interconnection together to form a unit cell in such a small area of $0.3 \mu m^2$.

It is therefore necessary to develop a new layout method, since conventional layout methods as proposed thus far have been a limitation on cell area reduction. Thus far, conventional cells have a transistor, a capacitor and a contact hole located on the same planar surface. The sum of the transistor area, the capacitor area and the contact hole area is a main factor in cell area reduction. In other words, the area occupied by transistor, the capacitor and the contact hole for interconnecting a source area and a drain area must be less than $0.3 \mu m^2$ in area to form Gbit memory cells. Therefore, a three-dimensional cell structure is needed, and the lateral layout structure must be changed to a vertical layout structure to construct a memory cell having a small total area.

A trench structure and a stack structure are known as examples of three-dimensional cell structures. However, there are some problems with step generation in the stack structure. Also, there are some problems with patterning and cleaning processes in the stack structure.

Meanwhile, a cell structure proposed by Toshiba, in which an isolation area is minimized and a capacitor area is increased, is disclosed in IEDM, 1991, under the title "A Surrounding Isolation-Merged Plate Electrode (SIMPLE) Cell checkered layout for 256Mbit DRAMs and beyond".

However, the SIMPLE cell structure is required to have a contact hole for interconnection since a source area of the transfer transistor and a node of the capacitor storage are connected laterally. Also, a contact hole is required for connecting a drain area and a bit line. Accordingly, a unit device for a DRAM can not be formed within a $0.3 \mu m^2$ area with even a $0.1 \mu m$ design rule. Thus, it is impossible to form a memory cell with Gbit capacity and beyond, according to the SIMPLE cell structure.

Also, another cell structure proposed by Toshiba, in which a vertical transistor is used in a trench capacitor, is disclosed in IEDM, 1989, under the title "A Surrounding Gate Transistor(SGT) Cell for 64/256 Mbit DRAMs".

According to the SGT cell structure, an aspect ratio of the trench is rapidly increased to about 50, since the depth of the trench in the SGT cell structure must be $10 \mu m$ or more in order to obtain constant cell capacitance and electrical characteristics. Accordingly, an appropriate manufacturing process is impossible to realize. Also, it is very difficult to perform cleaning of the trench and pattern formation inside the trench.

Also, all devices in the SGT cell structure are formed inside a silicon pillar isolated by a matrix-type trench during a manufacturing process of the SGT cell. Accordingly, an additional process of connecting word lines is required. The process of forming the pillar and a capacitor is also very difficult. The possibility of shorting between a plate node and a capacitor in forming a gate electrode is also increased due to the weakness of isolation characteristics among memory cells.

SUMMARY OF THE INVENTION

Therefore, an object of the invention is to provide a semiconductor device with high integration density to remedy some of the aforementioned problems.

Another object of the present invention is to provide a method for manufacturing such a semiconductor device.

To accomplish the object, the present invention provides a semiconductor device comprising: a semiconductor substrate having a plurality of spaced apart first pillars formed therein with isolated first trenches therebetween and second pillars connected to the first pillars thereunder with isolated second trenches therebetween, the diameter of the second trenches being smaller than that of the first trenches; a first isolation insulating layer formed inside the first trenches and isolated by a gate insulating layer and gate electrode enclosing the first pillars; impurity-doped regions having a first and second impurity-doped region vertically formed in the first and second pillars and a channel region therebetween; a bit line surrounding said second pillars and connecting to said first impurity-doped region and said bit line being formed as a matrix type with said gate electrode; a second isolation insulating layer formed in the bottom of the first trenches and inside the second trenches, for isolating the bit lines; and a word line isolated by the first isolation insulating layer and connected to the gate electrode.

The semiconductor device further comprises a stack-structured capacitor having a storage node, dielectric layer and plate electrode, the stack-structured capacitor being wrapped around the top portion of first pillars. The stack-structured capacitor is a pin or cylinder type capacitor.

Also, the storage electrode and the word line are isolated by the first isolation insulating layer. The impurity-doped regions and the channel region are a transistor vertically formed on the surface of the first and second pillars. The first impurity-doped region acts as a drain region and the second impurity-doped region act as a source region, respectively.

To accomplish the another object, the present invention provides a method for manufacturing a semiconductor device comprising the steps of: forming a plurality of first trenches and first pillars therebetween by etching a semiconductor substrate; forming a spacer on the sidewalls of the first pillars; forming second trenches and second pillars therebetween by further etching the semiconductor substrate having first trenches and first pillars using the spacer as an etching mask; forming an insulating layer in the bottom of the second trenches; removing the spacer used as an etching mask; forming a bit line surrounding the second pillars; forming a first impurity-doped region near a surface of the second pillars; forming a first isolation insulating layer between the bit lines and in the bottom of the first trenches; forming a gate insulating layer on the sidewalls of the first pillars; forming a gate electrode on a part of sidewall of the gate insulating layer and in the bottom of the first trenches, the gate electrodes being connected with each other to form a word line; forming a second isolation insulating layer buried in the first trenches in order to insulate the word line; and forming a second impurity-doped region by implanting an impurity into the sidewalls of the first pillars exposed to an atmosphere by the gate electrode.

The semiconductor device further comprises a step of forming a capacitor, the capacitor being wrapped around the top portion of the first pillars. The capacitor is a pin or cylinder type capacitor, and the capacitor of the present invention is formed by: forming an insulating pattern on the second isolation insulating layer; forming a first conductive layer over the entire surface of the semiconductor substrate; forming a spacer on the sidewalls of the conductive layer; forming a second conductive layer over the entire surface of the semiconductor substrate; exposing the insulating layer pattern and spacer to an atmosphere by etching the second conductive layer via an etch-back process; forming a column-shaped storage node by removing the insulating layer pattern and spacer; and forming a dielectric layer and plate node over the entire surface of the storage node.

A step of implanting an impurity can be performed before the step of forming the gate insulating layer, in order to control a threshold voltage. The spacer is comprised of three layers in the form of a thermal oxide, a nitride layer and a CVD oxide layer. The contact size between the bit line and the first impurity-doped region is determined by the depth of the second trenches. An isolation size of the first impurity-doped region is determined by etching depth of the semiconductor substrate having the second trenches.

According to the present invention, the process procedure can be easily performed due to shallow trenches having 2~3 μm depth and pillars. Also, a design margin for closely spaced layer can be ensured for forming a capacitor on upper portion of the first pillars, since the word line and bit line buried the first and second trenches and surrounded the first and second pillars. An efficiency of cell area can also be maximized by increasing a ratio of cell area to node area.

BRIEF DESCRIPTION OF THE DRAWINGS

The above objects and advantages of the present invention will become more apparent by describing in detail a preferred embodiment thereof, with reference to the attached drawings in which:

FIG. 4A to 18A are cross-sectional views taken along the word line of FIG. 1, sequentially illustrating steps in a method for manufacturing a semiconductor device according to the present invention; and FIG. 4B to 18B are cross-sectional views corresponding to FIG. 4A to 18A and taken along the bit line of FIG. 1, method for manufacturing a semiconductor device according to the present invention.

DETAILED DESCRIPTION OF THE INVENTION

The present invention will be described, hereinafter, in more detail, with reference to the accompanying drawings.

Figure 1:
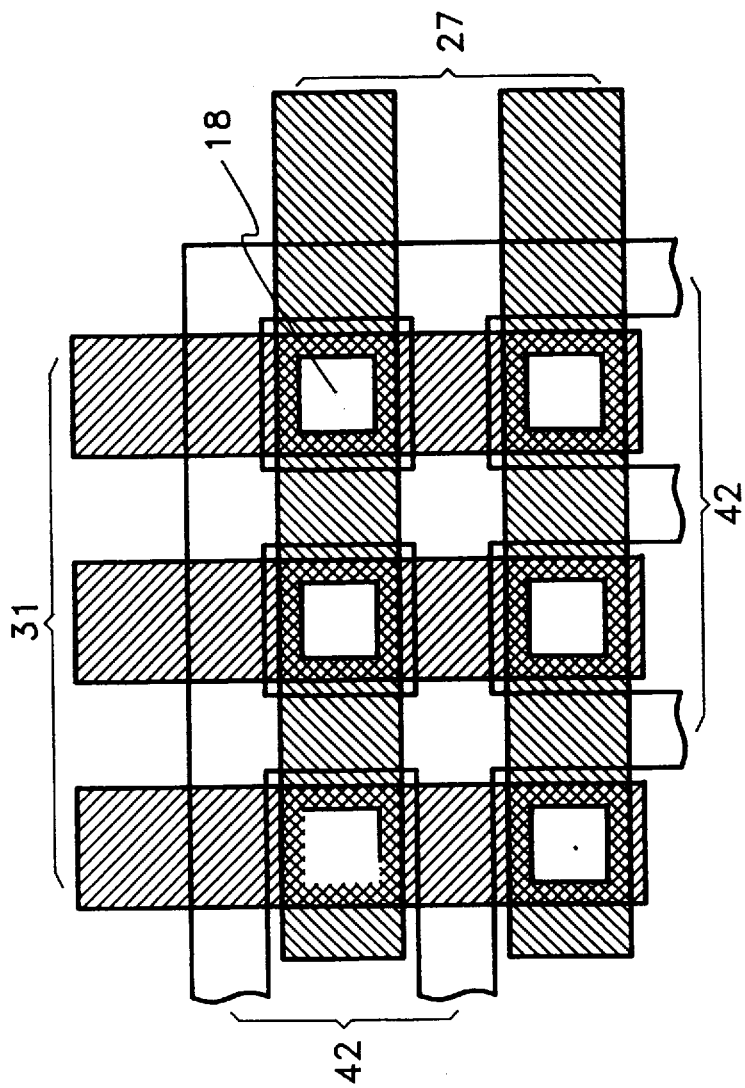
FIG. 1 is a layout view according to the present invention.

FIG. 1 is a layout plan view according to the present invention. The reference numerals 18 are pillars formed in the substrate. Reference numerals 31 indicate gate electrodes extending in a word-line direction. Also, the reference numerals 27 indicate bit lines. Reference numeral 42 is a pattern for forming a storage node.

Figure 2A:
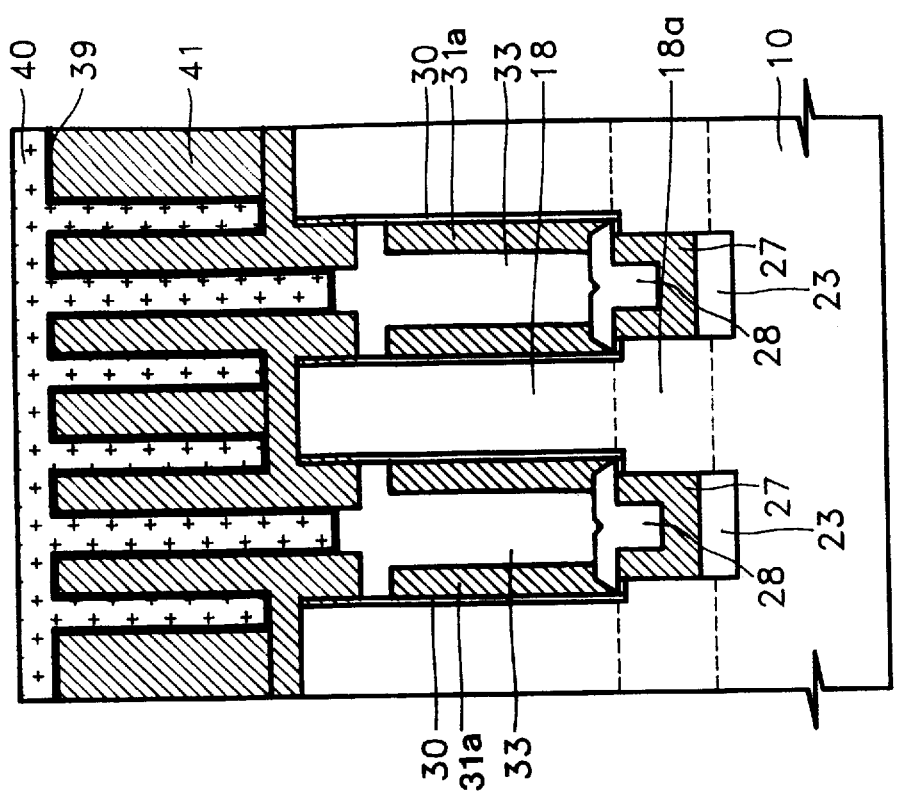
FIG. 2A and FIG. 2B are cross-sectional views taken along the word line and bit line of FIG. 1, respectively.
Figure 2B:
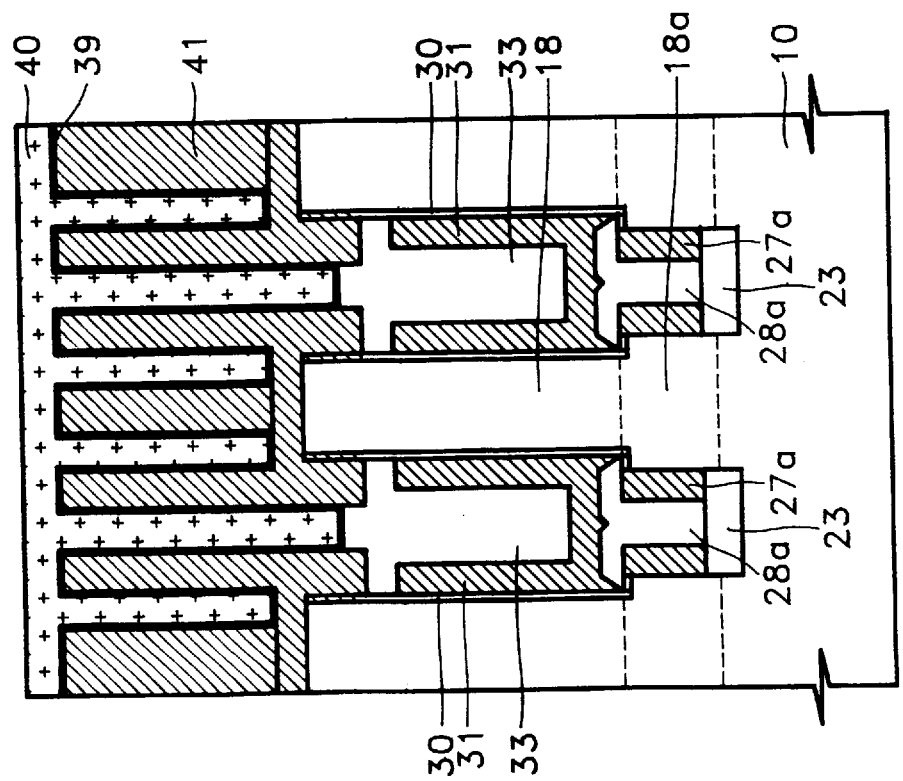

FIG. 2A and FIG. 2B are cross-sectional views taken along the word line and bit line of the FIG. 1, respectively.

Referring to the FIG. 2A and FIG. 2B, a plurality of spaced apart first pillar portions 18, which are isolated from one another by first trenches formed by etching a substrate 10, are formed. A plurality of second pillar portions 18a, which are disposed under the first pillar portions 18 and isolated from one another by second trenches are formed. A gate oxide layer 30 and a gate electrode 31(31a) are formed on the sidewalls of each of the first pillar portions 18 and in part of the bottom of the first trenches. The gate electrode 31(31a) is insulated by isolation insulating layers 33 and 28(28a) formed above and below the gate electrode.

Especially, in the cross-sectional view of FIG. 2A, taken along the word line of FIG. 1, the gate electrode 31 is formed in the bottom of first trenches and thus connected. Whereas, in a cross-sectional view of FIG. 2B taken along the bit line of FIG. 1, the gate electrode 31a is not interconnected.

A bit line 27(27a) is formed on the sidewalls of the second pillar portions 18a and in the bottom of the second trenches. An isolation insulating layer 28(28a) and a first insulating layer 23 insulate the bit line 27(27a).

Especially, in a cross-sectional view of FIG. 2A, taken along the word line of FIG. 1, the bit line 27a is not interconnected. Whereas, in a cross-sectional view of FIG. 2B taken along the bit line of FIG. 1, the bit line 27 is formed in the bottom of the second trenches is and thus interconnected.

Additionally, a storage node 41 is formed on an isolation insulating layer 33 on top of the first pillar portions 18. A dielectric layer 39 and a plate node 40 are sequentially formed thereon, so as to form a capacitor.

Figure 3:
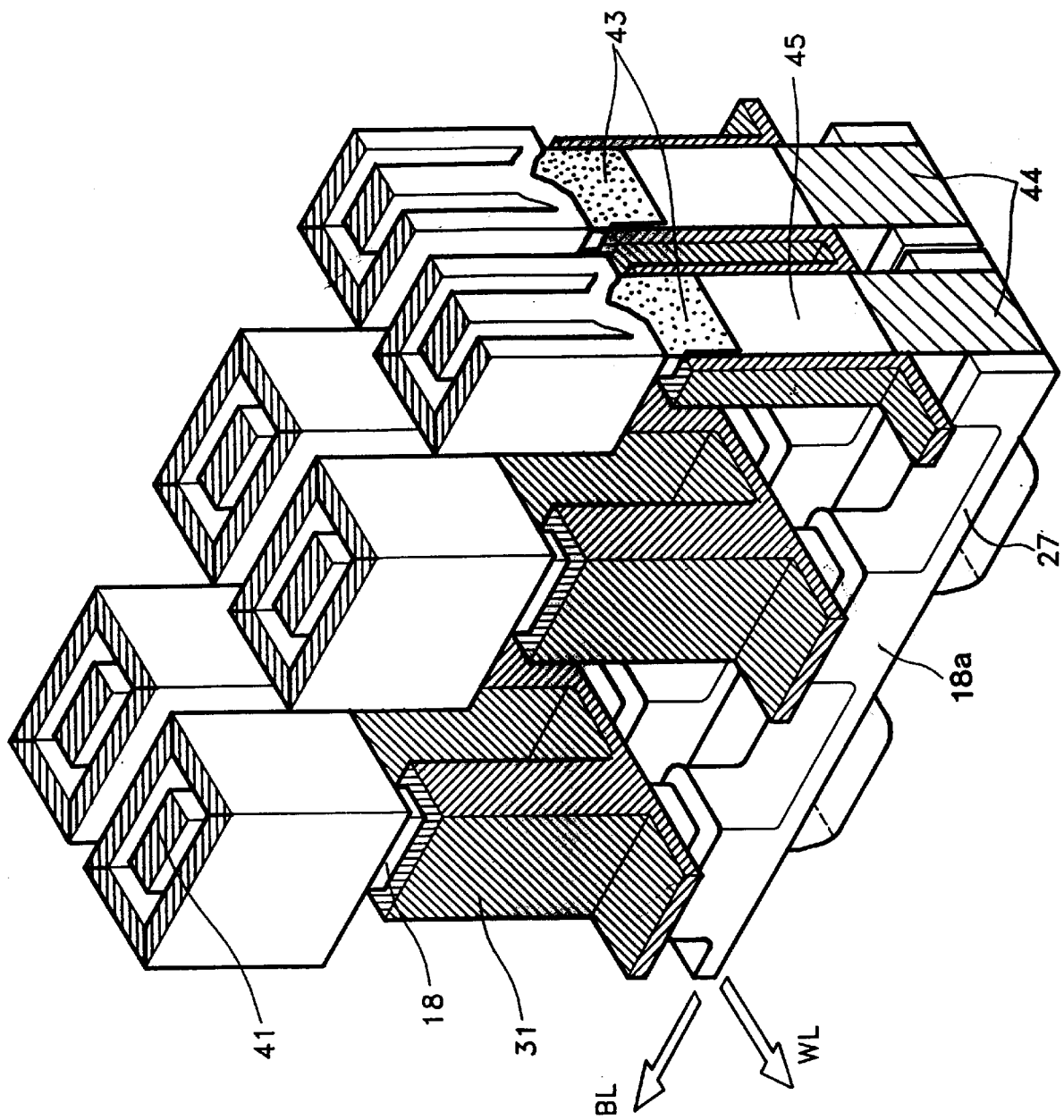
FIG. 3 is a perspective view of the memory cell structure according to the present invention.

FIG. 3 is a perspective view showing a semiconductor device according to the present invention.

First of all, "WL" and "BL" represent word line direction and bit line direction, respectively. Additionally, plate node 40 and insulating layers 23, 28, 33, and 39 are not shown in FIG. 3 for the sake of clarity.

A plurality of first pillar portions 18 are framed by etching a substrate (not shown). A plurality of second pillar portions 18a are disposed under the first pillar portions 18. A word line 31, which, in part, surrounds the first pillar portions 18 is formed. A bit line 27, in part, surrounding the second pillar portions 18a is also formed.

Additionally, a first impurity-doped region 44 and a second impurity-doped region 43 are vertically formed near surface of the second pillars 18a and the first pillars 18, and a channel region 45 is formed between the first impurity-doped region 44 and the second impurity-doped region 43. The first impurity-doped region 44 acts as a drain region and the second impurity-doped region 43 act as a source region. Hereinafter, the first impurity-doped region 44 designates a drain region and the second impurity-doped region 43 designates a source region. The drain region 44 is connected to bit line 27 and the source region 43 is connected to a storage node 41, which surrounds the top of the first pillars 18. The storage node 41 is constructed in the form of column shape, and a dielectric layer and a plate node are sequentially formed on the storage node 41, to thereby forming a capacitor.

Hereinafter, the manufacturing method of the present invention is explained in more detail with the following accompanying drawings.

FIG. 4A to 18A are sequential cross-sectional views taken along a word line of FIG. 1 to illustrate a manufacturing method of a semiconductor device according to the present invention. Also, FIG. 4B to 18B are sequential cross-sectional views taken along the bit line of FIG. 1 to illustrate a manufacturing method of semiconductor device according to the present invention. FIG. 4A and 4B, 5A and 5B, etc. illustrate corresponding views of the same step.

FIG. 4A and FIG. 4B show step of sequentially forming a pad oxide layer 11, a buffer layer 12, n layer 12, a first silicon nitride layer 13 and a first oxide layer 14 on a semiconductor substrate 10.

A pad oxide layer 11, e.g., a CVD oxide layer or thermal oxide layer, is formed to thickness of 100~400Å on a semiconductor substrate 10. A buffer polysilicon buffer layer 12 is formed on the pad oxide layer 11 by depositing polysilicon material. After a first silicon nitride layer 13 is formed on the polysilicon buffer layer 12, a first oxide layer 14 is formed on the first silicon nitride layer 13 by a CVD method.

Next, a photoresist material is coated on the first oxide layer 14 and patterned to form a photoresist pattern 15a. The photoresist pattern 15a is used as an etching mask for etching the layers 14, 13, 12, 11 and semiconductor substrate 10, and thus for forming pillars by a subsequent process.

FIG. 5A and FIG. 5B show step of forming a plurality of first pillar portions 18 by etching the semiconductor substrate 10. Note that FIG. 5A and 5B are not necessarily shown with the same scale as FIG. 4A and 4B.

The pad oxide layer 11, the buffer polysilicon layer 12, the first silicon nitride layer 13 and the first oxide layer 14 are etched using the photoresist pattern 15a as an etching mask. Thereafter, the semiconductor substrate 10 is also etched using the photoresist pattern 15a as an etching mask to thereby form a plurality of first pillar portions 18 with first trenches 19 therebetween. The width and depth of the first trenches 19 are about 0.1~0.15 μm and 1~2 μm, respectively, and can be variable according to the length of the vertical transistor.

Next, a second oxide layer 15 is formed on the entire surface of the semiconductor substrate 10, including the first pillar portions 18 by a thermal oxidation method. Then, a second silicon nitride layer 16 and a third oxide layer 17 are sequentially formed and etched-back. As a result, a first spacer 100 collectively comprising the second oxide layer 15, the second silicon nitride layer 16 and the third oxide layer 17 is formed on the sidewalls of the first pillars 18.

FIG. 6A and FIG. 6B illustrate a step of etching the semiconductor substrate 10 having the first trenches 19 a second time.

The semiconductor substrate 10 is etched again using the first spacer 100 as an etching mask, to thereby form second trenches 20 and second pillar portions 18a therebetween. Second trenches 20 are disposed below the first trenches 19. Second trenches 20 are etched to a depth of 0.5~1 μm from the bottom (lower portion) of the first pillar portions 18 into the semiconductor substrate. This etched depth can be variably controlled according to the contact size of an impurity-doped region, e.g., a drain region formed by a subsequent process.

FIG. 7A and FIG. 7B show step of forming a third silicon nitride layer 21 on a sidewall of the first pillar portions 18 (over first spacers 100) and the second pillar portions 18a.

More specifically, a third silicon nitride layer 21 is formed on sidewall of the first pillar portions 18 (over first spacers 100) and the second pillar portions 18a, in order to protect against thermal oxidation.

FIG. 8A and FIG. 8B illustrate a step of etching the semiconductor substrate a third time.

The semiconductor substrate 10 with first trenches 19 and second trenches 20 is etched a third time using first spacers 100 and third silicon nitride layer 21 as an etching mask, to thereby form third trenches 22 and third pillar portions 18b therebetween. The bottom of the third trenches 22 deeper than that of the second trenches 20. An insulating layer is formed in third trenches 22 by a subsequent process. The etched depth and width of the third trenches 22 can be variably controlled according to a contact size between the bit line and the drain region, and the size of an isolation insulating layer, formed by subsequent process.

Figure 9A:
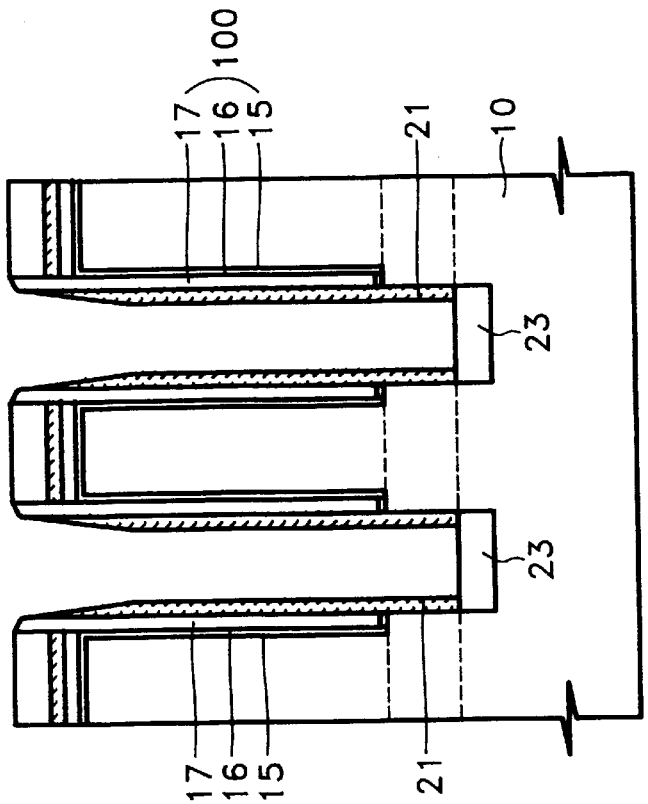
Figure 9B:
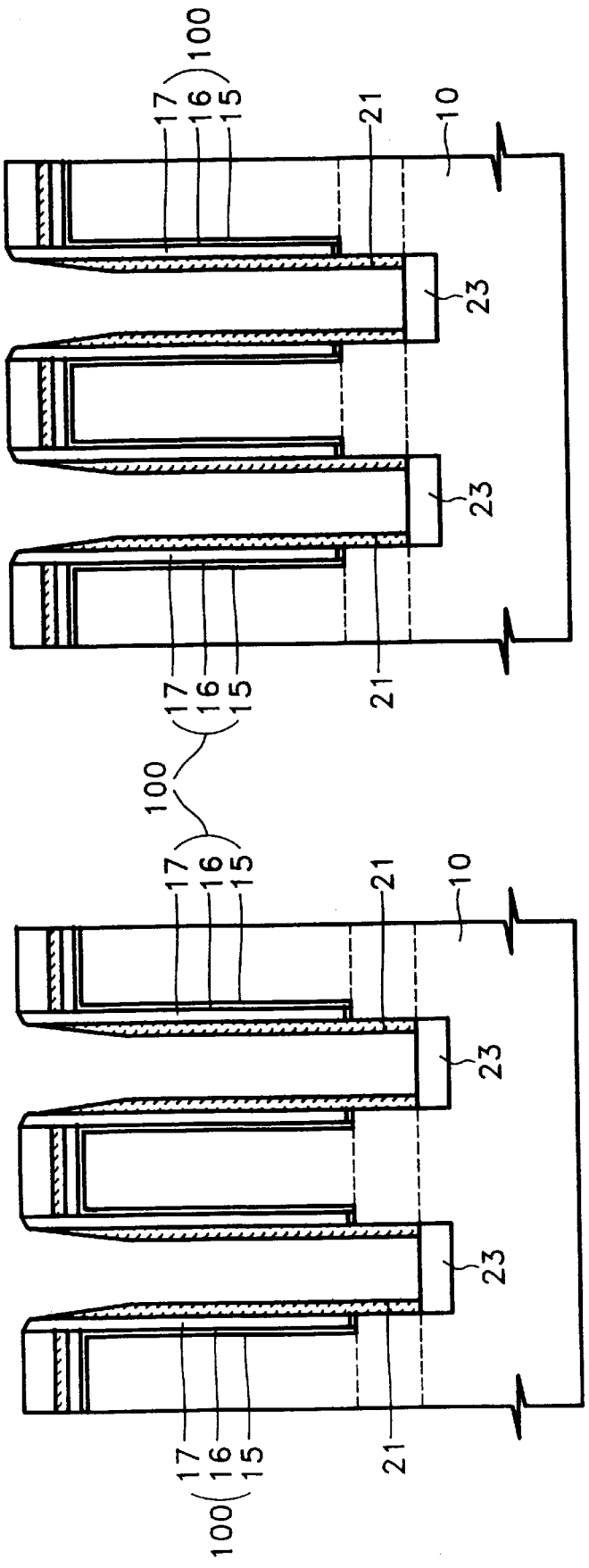

FIG. 9A and FIG. 9B illustrate a step of forming a fourth oxide layer 23 in the third trenches 22.

More specifically, a fourth oxide layer 23 is formed in the third trenches 22 by a thermal oxidation method. The fourth oxide layer 23 acts as an isolation insulating layer among bit lines.

FIG. 10A and FIG. 10B illustrate a step of forming a first polysilicon layer pattern 25(25a) for forming a bit line on the sidewalls of the first pillar portions 18 and second pillar portions 18a.

First, the third silicon nitride layer 21 is removed by a wet etching method, then an impurity-doped polysilicon layer (not shown) is formed over the entire surface of the semiconductor substrate. Next, a photoresist is coated on the polysilicon layer and patterned to form photoresist patterns 24 and 24a. The polysilicon layer is etched using the photoresist patterns 24 and 24a as etching masks, to thereby form the first polysilicon layer pattern 25(25a) on the sidewalls of the first pillar portions 18, the second pillar portions 18a, and on the first oxide layer 14 and the fourth oxide layer 23.

As seen in a cross-sectional view of FIG. 10B, taken along the bit line of FIG. 1, the first polysilicon layer pattern 25 is formed across the bottom of the second trenches 20 so that portions of first polysilicon layer pattern are interconnected. However, in FIG. 10A, taken along the word line of FIG. 1, the first portions of polysilicon layer pattern 25a are isolated in the bottom of the second trenches and are thus disconnected.

Figure 11A:
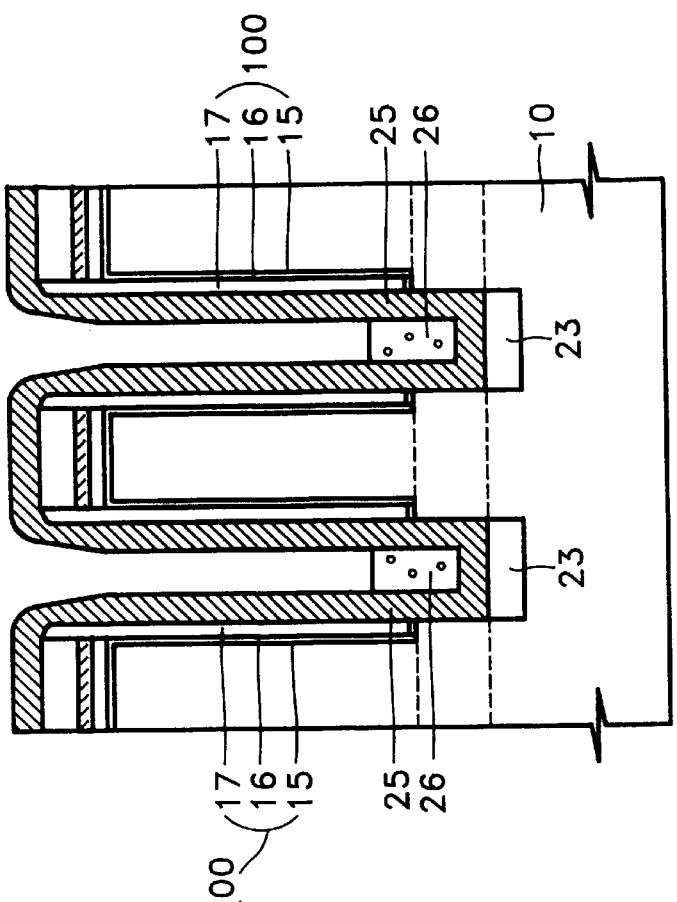
Figure 11B:
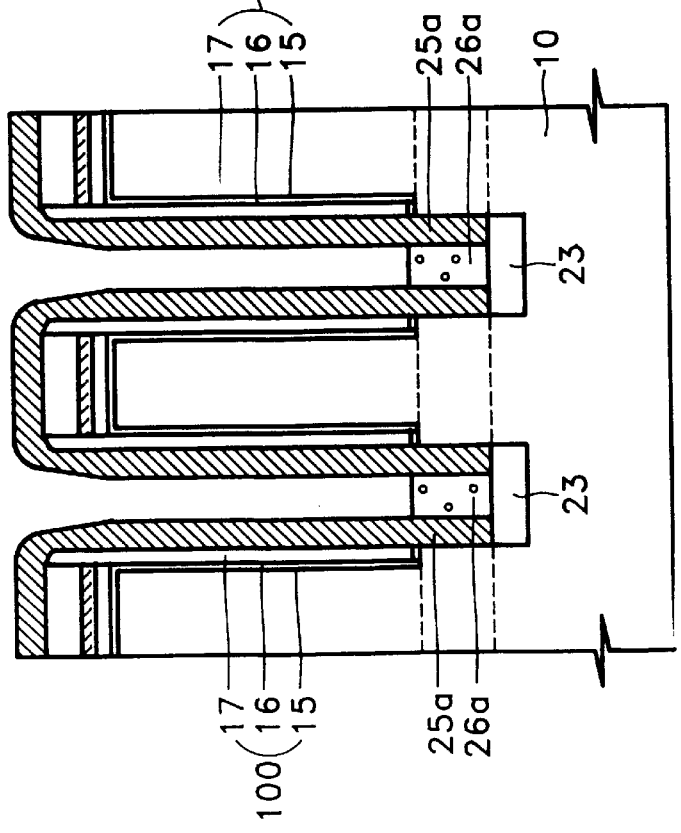

FIG. 11A and FIG. 11B illustrate a step of forming photoresist patterns 26(26a).

First, the photoresist patterns 24 and 24a are removed. Next, a photoresist layer is coated on the first polysilicon layer pattern 25(25a) and patterned to form a photoresist pattern 26(26a) having a predetermined depth measured from the bottom of second trenches 20, among the first polysilicon layers 25.

FIG. 12A and FIG. 12B illustrate a step of forming bit line 27(27a) by etching the first polysilicon layer 25(25a).

More specifically, the first polysilicon layer pattern 25(25a) is etched by a dry or wet etching method using the photoresist pattern 26(26a) and third oxide layer 17 as an etching mask. Thus, a bit lines 27(27a) is formed on the sidewalls of the second pillar portions 18a and at the bottom of the second trenches 22.

The third oxide layer 17 and photoresist pattern 26(26a) are then removed, and the bit line 27(27a) is oxidized to insulate the bit line 27(27a). As a result, a space between bit line 27(27a) is filled with a first isolation insulating layer 28(28a) formed by oxidizing the bit line 27(27a) using the second silicon nitride layer 16 as an oxidation masking layer. An impurity-doped region (not shown) is formed by out-diffusion of an impurity included in the bit line 27(27a). Next, boron is implanted into the surface of the first pillar portions 18, as indicated at 29, in order to control a threshold voltage of the vertical transistor. Then, the second oxide layer 15 and the silicon nitride layer 16 are removed.

In FIG. 12B, taken along the bit line of FIG. 1, the bit line 27 is formed in the bottom of the second trenches 20 and is therefore continuous. However, in FIG. 12A, taken along the word line of FIG. 1, the bit lines 27a are isolated in the bottom of the second trenches 20 and thus disconnected.

FIG. 13A and FIG. 13B illustrate step of forming a second polysilicon layer pattern 31(31a) as a word line on the sidewalls of the first pillar portions 18.

A gate oxide layer 30 is first formed on the sidewalls of the first pillar portions 18. A polysilicon layer is then formed over the surface of the device structure. Next, a photoresist layer is formed on the polysilicon layer and is patterned to form a photoresist pattern 24b(24c).

Thereafter, the polysilicon layer is etched to form a second polysilicon layer pattern 31(31a) on the sidewalls of the first pillar portions 18 using the photoresist pattern 24b(24c) as an etching mask.

As seen, in FIG. 13B, taken along the bit line of the FIG. 1, the sub-portions of second polysilicon layer pattern 31a are isolated at the bottom of the first trenches 19 and are thus disconnected. However, in FIG. 13A, taken along the word line of FIG. 1, the sub-portions of second polysilicon layer pattern 31 are connected at the bottom of the first trenches 19.

FIG. 14A and FIG. 14B illustrate a step of forming a photoresist layer and overall etching the photoresist layer on the second polysilicon layer 31(31a).

After the photoresist pattern 24b(24c) is removed, a photoresist layer (not shown) is formed over the entire surface of the semiconductor substrate 10 having the second polysilicon layer 31(31a). Then, the photoresist layer is entirely etched to a predetermined depth from the top of first pillar portions 18, to thereby form a photoresist pattern 32.

Thereafter, the second polysilicon layer 31(31a) is etched by a dry or wet etching method using a photoresist pattern as an etching mask. As result, a word line is formed on a portion of the sidewall of the first pillar portions 18 and in bottom of the first trenches 19. The etching of the second polysilicon layer 31(31a) is performed to a predetermined depth from the top of first pillar portions 18 in the present embodiment. However, the second polysilicon layer 31(31a) for a word line could also be formed to the top of first pillars 18.

FIG. 15A and FIG. 15B show step of forming a word line 31(31a).

First, photoresist pattern 32 is removed. Thus, the word line 31(31a) is formed on sidewalls of the first pillar portions 18 and in the bottom of the first trenches 19. Then, an isolation insulating layer 33 for insulating the word line 31(31a) is formed by depositing a oxide material over the surface of the semiconductor substrate and etching the oxide material via an etch-back process. An isolation insulating layer 33 can also be formed by oxidizing of the word line. Next, an implantation process 34 is performed using phosphorous or arsenic on the surface of the semiconductor substrate, to form a source area of a vertical transistor (not shown).

In FIG. 15A, taken along the word line of FIG. 1, the word line 31 is formed in the bottom of the first trenches 19 and is thus continuous. Whereas, in FIG. 15B, taken along the bit line of FIG. 1, the word line 31a is isolated at the bottom of first trenches 19 and is thus discontinuous.

Figure 16A:
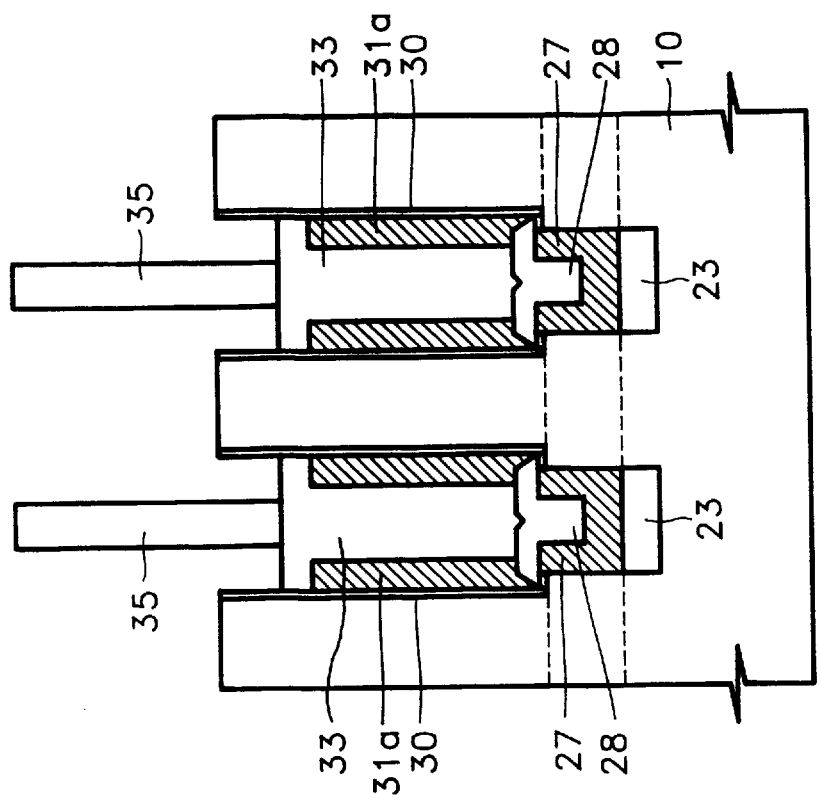
Figure 16B:
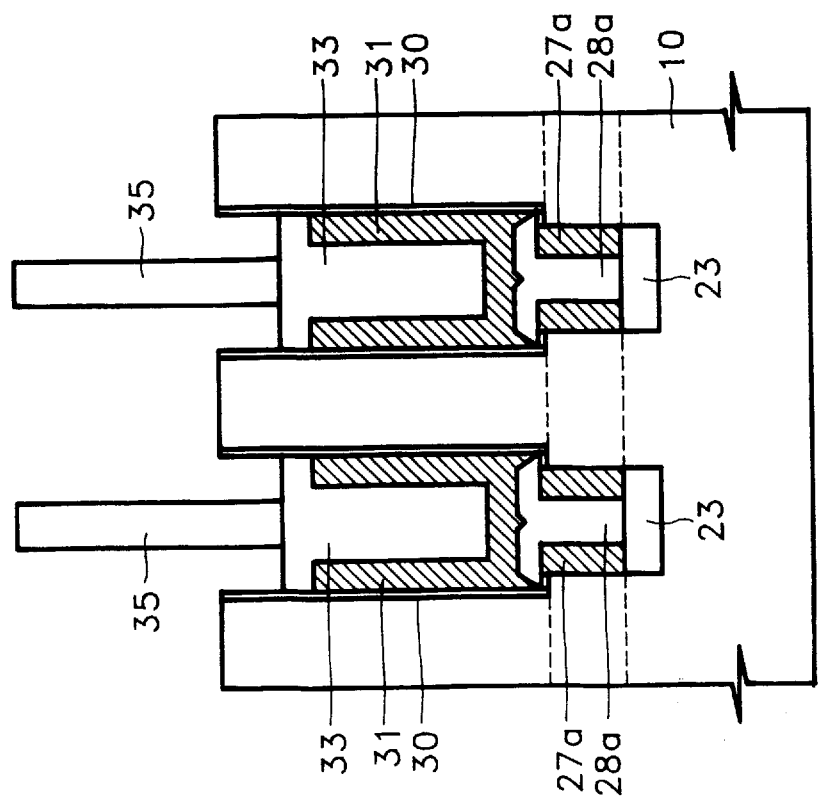

FIG. 16A and FIG. 16B illustrate a step of forming a fifth oxide layer pattern on the isolation insulating layer 33.

A fifth oxide layer is formed using a CVD method and is patterned to form a generally column-shaped fifth oxide layer pattern 35. The width of the fifth oxide layer pattern 35 determines the space between storage nodes.

Figure 17A:
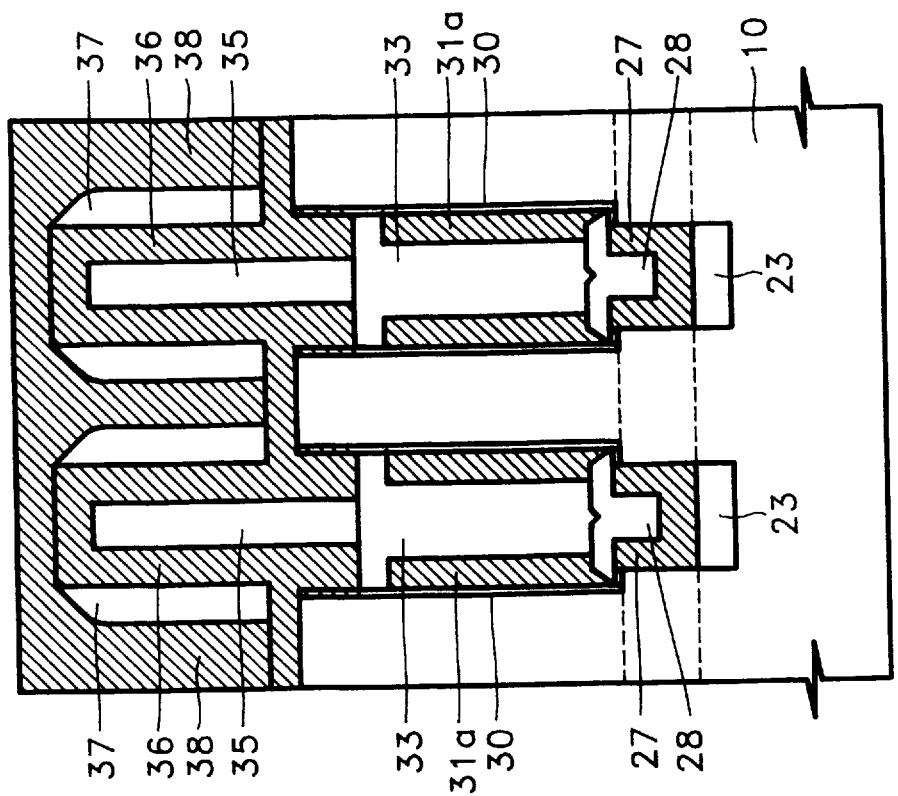
Figure 17B:
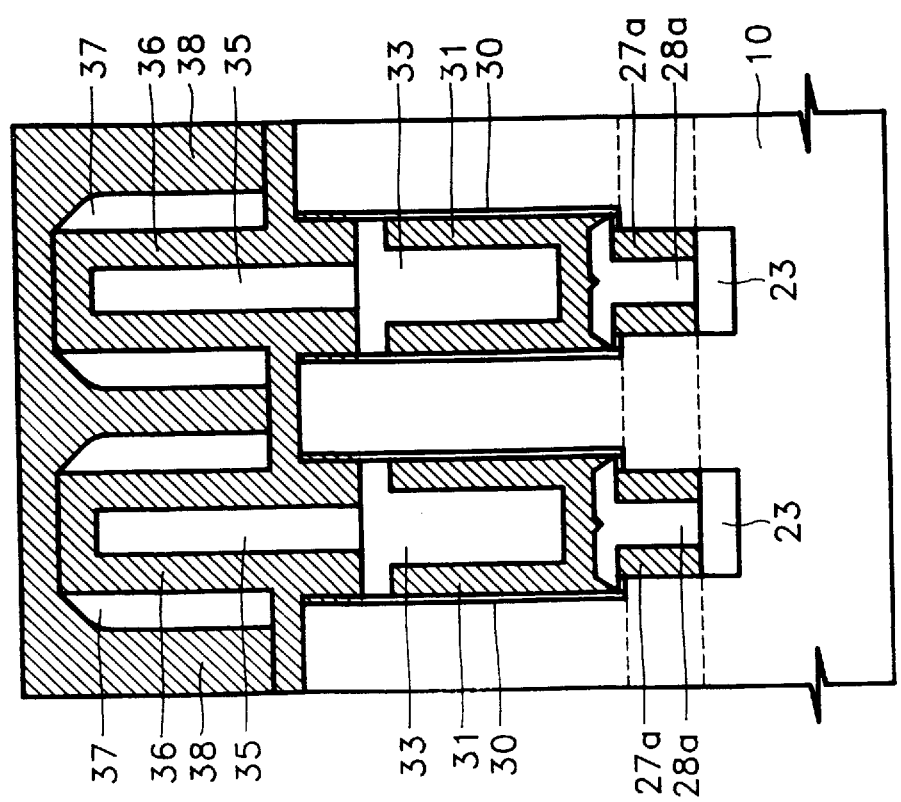

FIG. 17A and FIG. 17B illustrate the steps of forming a third polysilicon layer 36, a second spacer 37 and a fourth polysilicon layer 38.

A third polysilicon layer 36 is formed over the entire surface of the semiconductor substrate with the fifth oxide layer pattern 35. The third polysilicon layer 36 serves as a first conductive layer. At this time, exposed portions of isolation insulating layer 33 are covered by the third polysilicon layer 36. Next, an oxide layer is formed over the resultant structure, including third polysilicon layer 36, by a CVD method and is etched to form a second spacer 37 on sidewalls of the third polysilicon layer 36 covering fifth oxide layer patter 35. Then, a fourth polysilicon layer 38 is formed on the surface of the resultant structure.

FIG. 18A and FIG. 18B show step of forming a storage node 41 and a plate electrode 40.

First of all, the fourth polysilicon layer 38 is etched via a etch-back process, and thus the fifth oxide layer 35 and the second spacer 37 are exposed to the atmosphere. Next, the exposed the fifth oxide layer 35 and the second spacer 37 are removed by a wet etching method. As a result, a storage node 41 consisting of the third polysilicon layer 36 and the fourth polysilicon layer 37 is formed like a column-shaped.

Then, a dielectric layer 39 as three layer, e.g., oxide layer/nitride layer/oxide layer, is formed over entire surface of the storage node 41. Next, a plate node 40 with a polysilicon layer is formed over the resultant material, to thereby form a memory device.

According to the present invention, an interconnection process for the source region of transistor and storage node of capacitor is formed vertically and an area for contacting is not required. Accordingly, a unit device of DRAMs can be formed within 0.3 $\mu m^2$ area with a 0.1 $\mu m$ design rule.

The process procedure can be easily performed due to a shallow trenches having 2~3 $\mu m$ depth and pillars. And, a design margin for closely spaced layer can be ensured for forming a capacitor on upper portion of the first pillars, since the word line and bit line buried the first and second trenches and surrounded the first and second pillars. An efficiency of cell area can also be maximized by increasing a ratio of cell area to a node area.

The present invention solves some problems due to the deep trenches and step by controlling the height of first pillars, second pillars and a storage node of a capacitor. Also, a cell leakage current can be minimized since a source region connected to a storage node is only closely spaced. Also, a contact resistance can be minimized without a cell area reduction, since a storage node, a bit line, a source region and drain region are formed surrounding first and second pillars via self-align method.

While the present invention has been particularly shown and described with reference to a particular embodiment thereof, it will be understood by those skilled in the art that various changes in form and details may be effected therein without departing from the spirit and scope of the invention as defined by the appended claims.

What is claimed is:

1. A semiconductor device, comprising:
   a semiconductor substrate having a plurality of spaced apart first pillars formed therein with isolated first trenches therebetween and second pillars connected to said first pillars thereunder with isolated second trenches therebetween, a width of said second trenches being smaller than a width of said first trenches;

a first isolation insulating layer formed inside said first trenches and isolated by a gate insulating layer and gate electrode enclosing said first pillars;

impurity-doped regions having a first and a second impurity-doped region vertically formed in said first and second pillars and a channel region therebetween;

a bit line surrounding said second pillars and connected to said first impurity-doped region, said bit line being formed as a matrix type with said gate electrode;

a second isolation insulating layer formed in the bottom of said first trenches and inside said second trenches, for isolating said bit lines; and a word line isolated by said first isolation insulating layer and connected to said gate electrode.

2. A semiconductor device as claimed in claim 1, further comprising a stack-structured capacitor having a storage node, dielectric layer and plate electrode, said stack-structured capacitor being wrapped around the top portion of said first pillars.

3. A semiconductor device as claimed in claim 2 wherein said stack-structured capacitor is a pin or cylinder type capacitor.

4. A semiconductor device as claimed in claim 2 wherein said storage node and said word line are isolated by said first isolation insulating layer.

5. A semiconductor device as claimed in claim 1 wherein said impurity-doped regions and said channel region are a vertical transistor formed on the surface of said first and second pillars.

* * * * *